(12) United States Patent
Shiotani et al.

(10) Patent No.: US 8,645,089 B2
(45) Date of Patent: Feb. 4, 2014

(54) INFORMATION PROCESSING DEVICE AND INFORMATION PROCESSING METHOD

(75) Inventors: Tomohiro Shiotani, Kanagawa (JP);
Mikio Takenaka, Kanagawa (JP);
Hiroshi Hasegawa, Kanagawa (JP);
Kazuhiko Miyahara, Kanagawa (JP);
Yoshiaki Inoue, Aichi (JP)

(73) Assignee: Sony Corporation, Tokyo (JP)

(*) Notice: Subject to any disclaimer, the term of this patent is extended or adjusted under 35 U.S.C. 154(b) by 331 days.

(21) Appl. No.: 13/176,257

(22) Filed: Jul. 5, 2011

(65) Prior Publication Data

US 2012/0010834 A1 Jan. 12, 2012

(30) Foreign Application Priority Data

Jul. 12, 2010 (JP) ................. P2010-157540

(51) Int. Cl.
*G01R 19/00* (2006.01)
*G01R 31/36* (2006.01)
*G06F 19/00* (2011.01)

(52) U.S. Cl.
USPC ........... 702/64; 136/252; 324/761.01; 702/63

(58) Field of Classification Search
USPC ................. 702/57, 64, 65, 63; 136/252, 263; 324/76.11, 691, 754.04, 761.01
See application file for complete search history.

(56) References Cited

U.S. PATENT DOCUMENTS 8,049,521 B2 * 11/2011 Lu et al. ................. 324/691
8,124,869 B2 * 2/2012 Mizuta et al. .......... 136/252

* cited by examiner

*Primary Examiner* — John H Le
(74) *Attorney, Agent, or Firm* — Sony Corporation

(57) ABSTRACT

Disclosed herein is an information processing device including a voltage measuring unit and a determining unit. The voltage measuring unit measures a voltage across the positive and negative terminals of a set of a plurality of dye-sensitized solar cells connected in series. The determining unit determines the number of the dye-sensitized solar cells not generating electricity according to the amount of voltage drop across the positive and negative terminals from the voltage across the positive and negative terminals in the initial state in which all the dye-sensitized solar cells of the set generate electricity at the voltage measured by the voltage measuring unit.

8 Claims, 14 Drawing Sheets

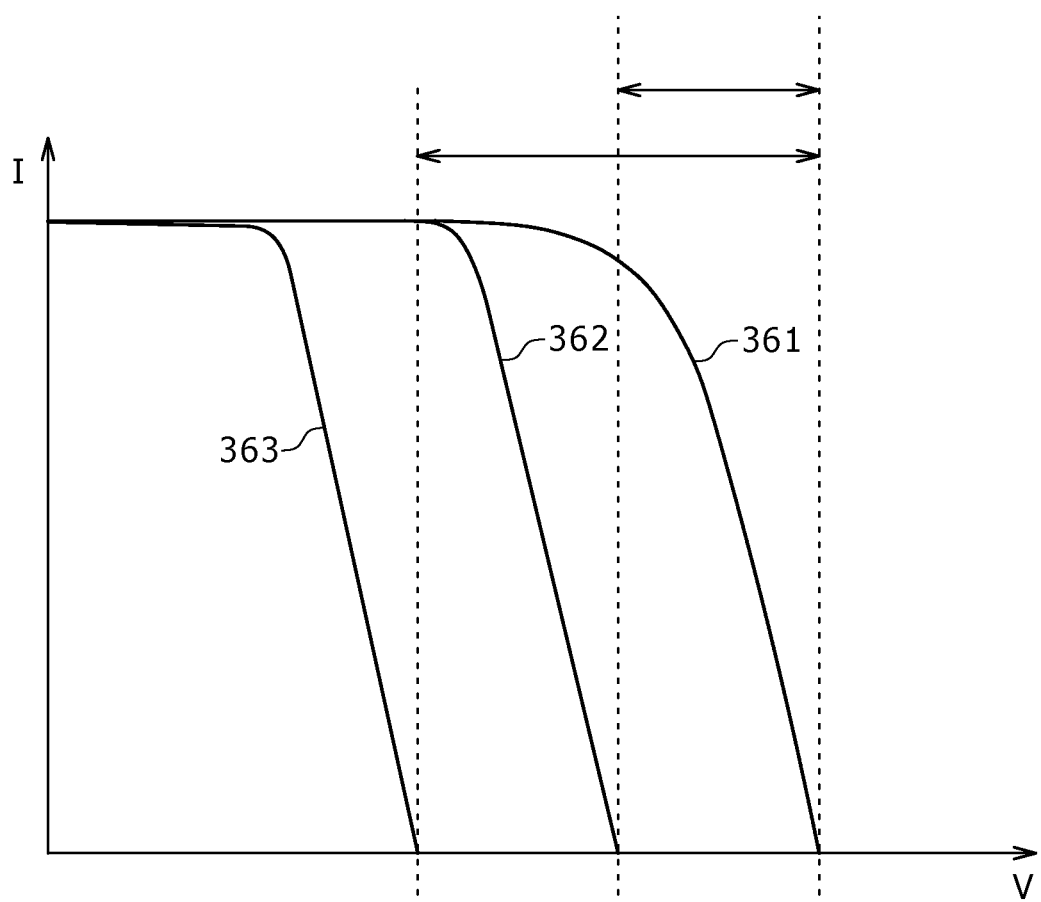

IN THE ABSENCE OF SHADOW

IN THE PRESENCE OF SHADOW

INFORMATION PROCESSING DEVICE AND INFORMATION PROCESSING METHOD

BACKGROUND

The present disclosure relates to an information processing device and an information processing method. More particularly, the present disclosure relates to an information processing device and an information processing method which are capable of easy detection of an object in detail.

There has been contrived a method for detecting the existence of an object by means of a solar cell or photoelectric conversion element as a sensor (as disclosed in Japanese Patent Laid-open No. Sho 61-118923 referred to as Patent Document 1 hereinafter, for example).

Patent Document 1 discloses an input switch composed of solar cells arranged in array. This input switch is so designed as to detect the position of the operated switch by monitoring the output voltage of individual solar cells arranged in array.

SUMMARY

In the method disclosed in Patent Document 1, the solar cells using an amorphous silicon and the like (so-called silicon-based solar cell) are used as the sensor. That is, it requires the solar cells arranged in array to be wired individually in order that it recognizes not only whether or not the switch has been operated but also the position of the switch which has been operated.

In other words, the related-art switch mentioned above needs not only complex wiring but also complex processing to monitor individual solar cells for interelectrode voltage if it is to recognize not only whether the switch has been operated (whether an object is present) but also which switch has been operated (the position of an object) for detection of an object in detail.

The present disclosure was completed in view of the foregoing. It is a desire of the present disclosure to provide an information processing device and an information processing method which are designed for easy detection of an object in detail.

One embodiment of the present disclosure resides in an information processing device including a voltage measuring unit configured to measure a voltage across the positive and negative terminals of a set of a plurality of dye-sensitized solar cells connected in series, and a determining unit configured to determine the number of the dye-sensitized solar cells not generating electricity according to the amount of voltage drop across the positive and negative terminals from the voltage across the positive and negative terminals in the initial state in which all the dye-sensitized solar cells of the set generate electricity at the voltage measured by the voltage measuring unit.

The information processing device may additionally have a process executing unit configured to execute processing according to the number of the dye-sensitized solar cells not generating electricity determined by the determining unit.

The determining unit determines the number of the dye-sensitized solar cells not generating electricity, thereby estimating the size of an object existing near the set, and determines according to the estimated size whether or not the object is to be processed. The process executing unit executes an alarming process to inform of the existence of the object in the case where the determining unit determines that the object is to be processed.

The dye-sensitized solar cells of the set are arranged such that they are divided into a prescribed plurality of regions and they are distributed among such regions in different numbers. The determining unit determines the number of the dye-sensitized solar cells not generating electricity, thereby identifying the region operated by the user among the plurality of regions. The process executing unit selects control signals corresponding to the identified regions and sends the thus selected control signals to other devices.

The dye-sensitized solar cells of the set are arranged in array.

The information processing device may also have a storage unit configured to store the electric power obtained from power generation by the dye-sensitized solar cells of the set.

The above-mentioned determining unit is further capable of determining, according to the amount of the voltage drop across the positive and negative terminals, the size of that portion of the regions in which the dye-sensitized solar cells do not generate electricity.

Another embodiment of the present disclosure resides in an information processing method for the information processing device which has a set of a plurality of dye-sensitized solar cells connected in series. The information processing device has a voltage measuring unit measuring voltages across the positive and negative terminals of the set. the information processing device also has a determining unit determining the number of the dye-sensitized solar cells not generating electricity according to the amount of voltage drop across the positive and negative terminals from the voltage across the positive and negative terminals in the initial state in which all the dye-sensitized solar cells of the set generate electricity at the voltage measured by the voltage measuring unit.

According to an embodiment of the present disclosure, the voltage across the positive and negative terminals of the set is measured, and the number of the dye-sensitized solar cells not generating electricity is determined according to the amount of voltage drop across the positive and negative terminals from the voltage across the positive and negative terminals in the initial state in which all the dye-sensitized solar cells of the set generate electricity at the voltage measured by the voltage measuring unit.

According to the present disclosure, objects can be detected much more easily.

BRIEF DESCRIPTION OF THE DRAWINGS

FIG. 11 is a diagram illustrating an example of voltage change;

DETAILED DESCRIPTION OF THE PREFERRED EMBODIMENTS

A description of the embodiments of the present disclosure is given below. It develops in the following order.
1. First embodiment (for sensor)
2. Second embodiment (for motion sensor window)
3. Third embodiment (for card-type remote controller)

1. First Embodiment

Sensor Relying on Silicon Based Solar Cell

The following description is given first which illustrates the object-detecting sensor that relies on the silicon based solar cell in the past.

Figure 1A:
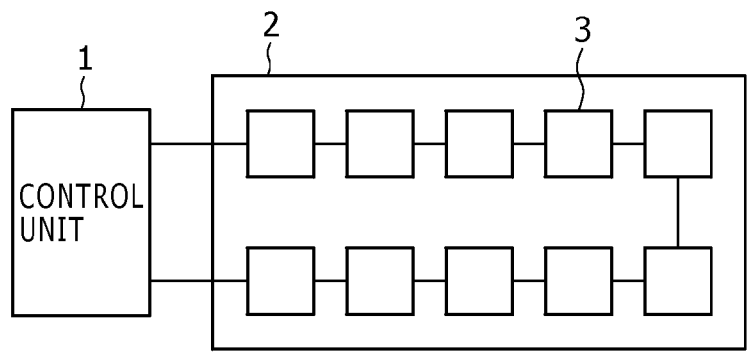
FIGS. 1A to 1C are diagrams illustrating an example of the sensor using silicon based solar cells.

FIG. 1A is a diagram showing an object-detecting sensor that relies on the silicon based solar cell made of an amorphous silicon. A silicon based solar cell 2 shown in FIG. 1A is a set of ten silicon based solar cells. Individual cells 3 are connected in series to a control unit 1. Incidentally, the silicon based solar cell 2 is installed in any place where it receives sunlight so that the individual cells generate electricity.

Figure 1B:
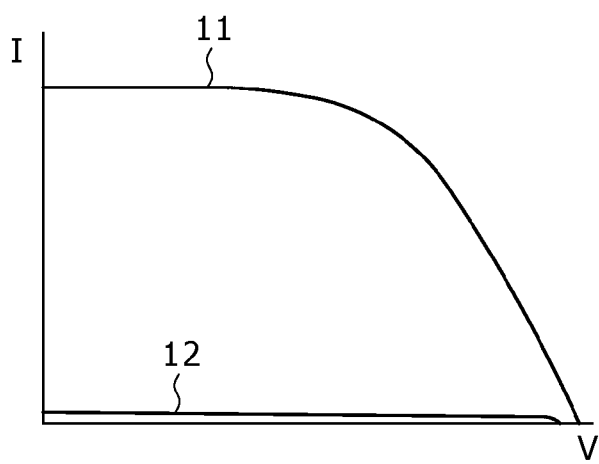

Each cell 3 of the silicon based solar cell has the I-V characteristics as shown in FIG. 1B. A curve 11 denotes the I-V characteristics of the cell 3 which generates electricity, and a curve 12 denotes the I-V characteristics of the cell 3 which does not generate electricity.

Figure 1C:
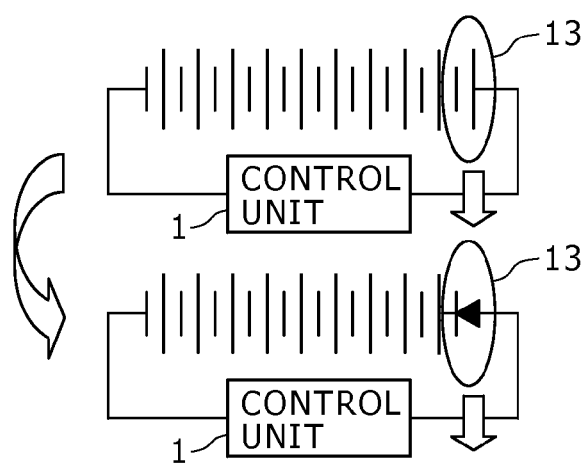

Any one cell in the silicon based solar cell 2 functions as a galvanic cell (encircled by an ellipse 3 in the upper circuit shown in FIG. 1C) when it generates electricity. Therefore, it produces a potential difference across its terminals. However, it functions as a backward diode (encircled by the ellipse 3 in the lower circuit shown in FIG. 1C) when it does not generate electricity. Therefore, it blocks electric current.

This brings about a situation in which no voltage appears in remaining cells and output voltage of the silicon based solar cell 2 greatly decreases.

Figure 2A:
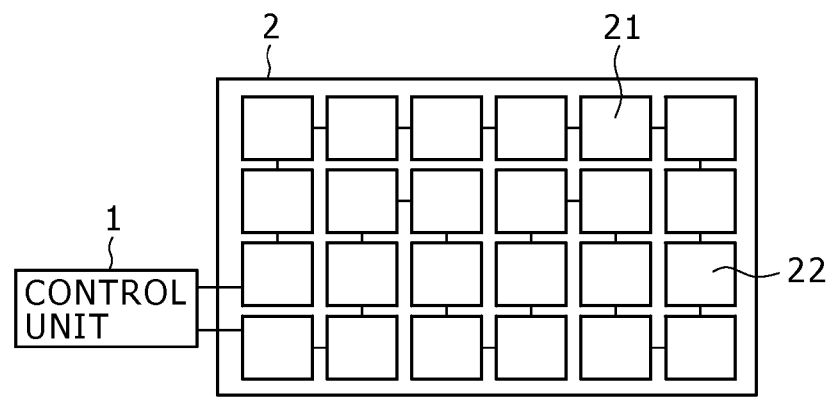
FIGS. 2A to 2C are diagrams illustrating an example of the sensor using silicon based solar cells.
Figure 2B:
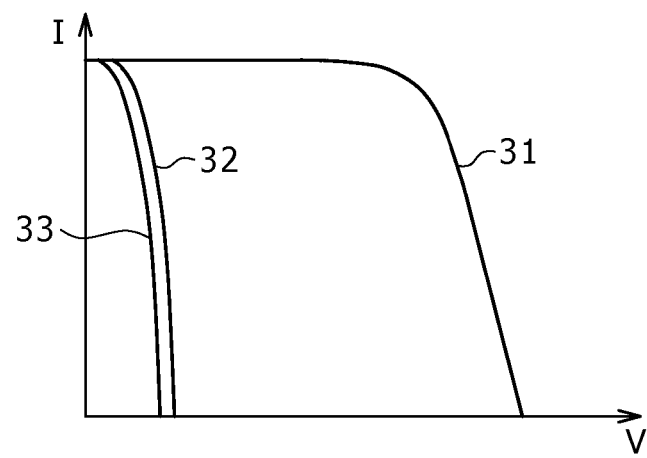

For example, the silicon based solar cell 2 having 24 cells connected in series is shown in FIG. 2A. It gives the I-V characteristics across its output terminals as shown in FIG. 2B. It is to be noted that this silicon based solar cell 2 is installed at a place where it is exposed to sunlight so that its cells generate electricity.

The silicon based solar cell 2 gives the I-V characteristics as indicated by a curve 31 in FIG. 2B if all of its cells generate electricity. Now, suppose that an object has approached the silicon based solar cell 2 and cast its shadow onto one of its cells (for example, a cell 21) to suspend the generation of electricity. Then, the silicon based solar cell 2 gives the I-V characteristics as indicated by a curve 32. Suppose further that another object has approached the silicon based solar cell 2 and cast its shadow onto another one of its cells (for example, a cell 22) to suspend the generation of electricity. Then, the silicon based solar cell 2 gives the I-V characteristics as indicated by a curve 33.

In other words, output voltage of the silicon based solar cell 2 greatly decreases when one of its cells stops generating electricity but does not decrease so much even though more than two cells stop generating electricity.

The foregoing suggests that the control unit 1 attached to the silicon based solar cell 2 cannot tell how many cells have stopped generating electricity, much less to identify specific cells which have stopped generating electricity, if output voltage alone is monitored.

Figure 2C:
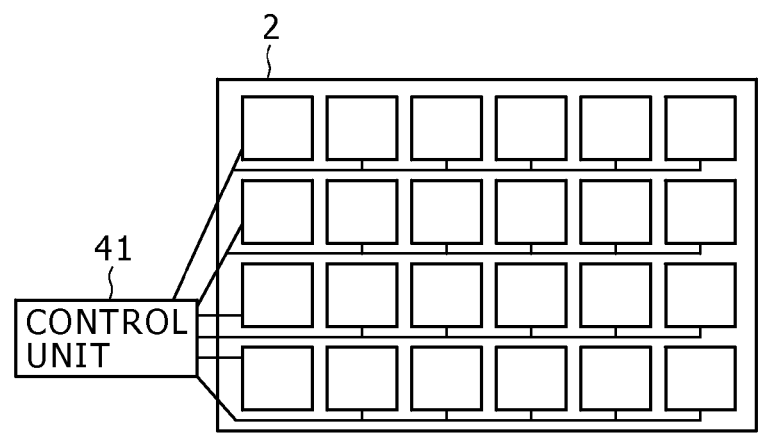

According to the method disclosed in Patent Document 1, this difficulty is avoided by wiring all the cells of the silicon based solar cell 2 as shown in FIG. 2C, so that a control unit 41 can monitor output voltage of the individual cells.

As mentioned above, the detecting system that relies on the silicon based solar cell 2 needs complex wiring to detect not only the presence of an object but also the details of an object, such as the shape, size and position of an object. Such complex wiring will reduce the area allocated to the cells on the silicon based solar cell and also reduce the efficiency of power generation per unit area.

Moreover, the foregoing method has the disadvantage that the control unit needs to monitor output voltage of individual cells, and this requires complex processing and increases load capacity.

[Sensor Relying on Dye-Sensitized Solar Cell]

Figure 3A:
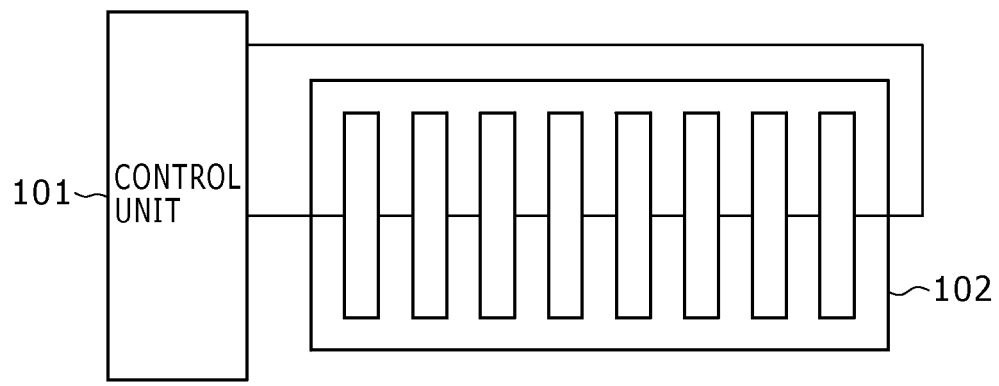
FIGS. 3A to 3C are diagrams illustrating an example of the sensor to which the present disclosure is applied.
Figure 3B:
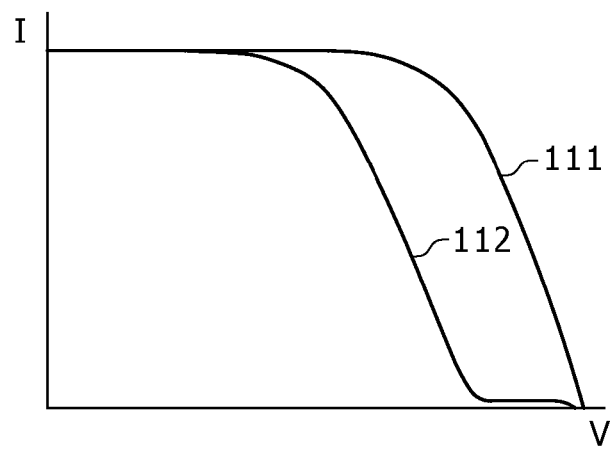
Figure 3C:
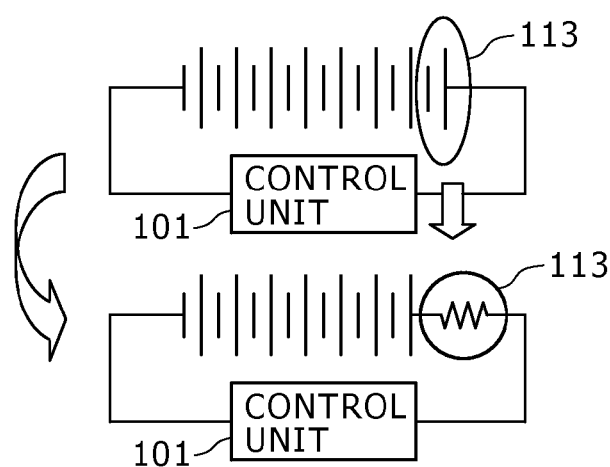

In view of the foregoing, the present inventors have decided to employ a dye-sensitized solar cell. FIGS. 3A to 3C are diagrams illustrating the sensor to which the present disclosure is applied. A dye-sensitized solar cell 102 shown in FIG. 3A is a set of a plurality of cells (eight in this case) connected in series. The dye-sensitized solar cell 102 has a control unit 101 connected to both terminals thereof. It is installed at any place where it is exposed to sunlight, so that the individual cells generate electricity.

Each cell of the dye-sensitized solar cell is comprised of a titania porous electrode carrying a sensitizing dye, a counter electrode, and an electrolytic solution interposed between them. The dye-sensitized solar cell obtains photovoltaic electricity using an organic dye.

If it is assumed that the dye-sensitized solar cell 102 gives the I-V characteristics indicated by the curve 111 in FIG. 3B when all of its cells generate electricity, the I-V characteristics changes into the one indicated by the curve 112 in FIG. 3B when one of the cells stops generating electricity.

In other words, output voltage of the dye-sensitized solar cell 102 decreases in proportion to the number of the cells which have stopped generating electricity.

The dye-sensitized solar cell functions as a battery and produces a potential difference across its terminals as encircled by the ellipse 113 in the upper circuit in FIG. 3C when its cells generate electricity. However, any one of the cells functions as a resistor without cutting off electric current when it does not generate electricity as encircled by the ellipse 113 in the lower circuit in FIG. 3C. Therefore, the cell (which has stopped generating electricity) decreases in voltage in proportion to the resulting resistance, but the remaining cells continue generating electricity without decreasing in voltage. Thus, in case of the dye-sensitized solar cell, the voltage drop of the cells connected in series is approximately proportional to the number of the cells which do not generate electricity.

Figure 4A:
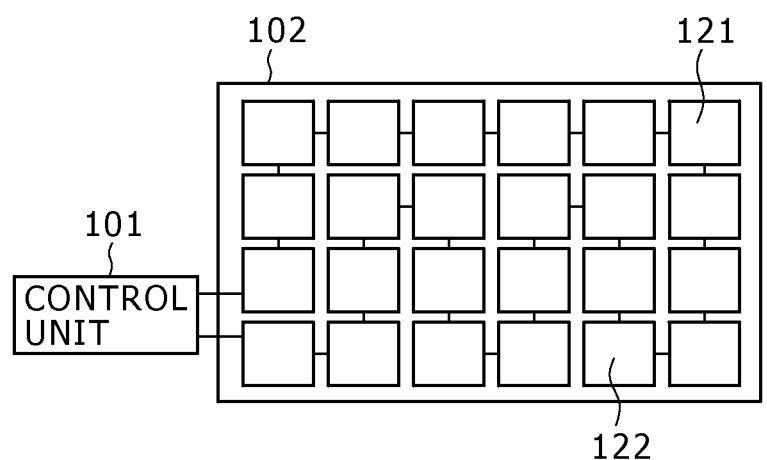
FIGS. 4A and 4B are diagrams illustrating an example of the sensor to which the present disclosure is applied.
Figure 4B:
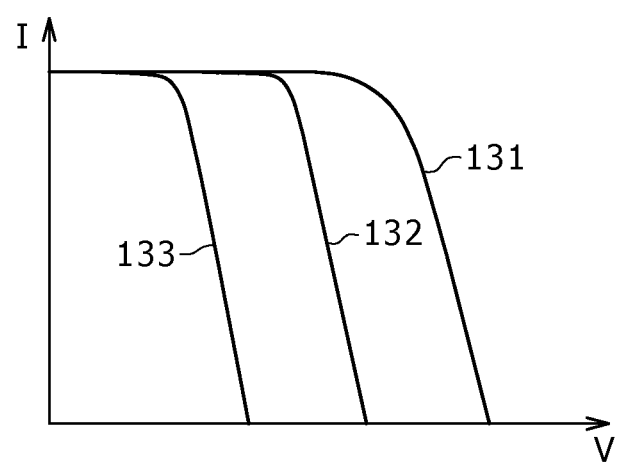

The dye-sensitized solar cell 102 having 24 cells connected in series (like the solar cell shown in FIG. 2) is shown in FIG. 4A. It gives the I-V characteristics across its output terminals as shown in FIG. 4B. When all of its cells generate electricity, it gives the I-V characteristics indicated by the curve 131 in FIG. 4B.

When an object approaches the dye-sensitized solar cell 102 and casts its shadow onto one of its cells (say, a cell 121), thereby causing the cell 121 to stop generating electricity, the I-V characteristics changes into the curve 132. Moreover, when another object approaches the dye-sensitized solar cell 102 and casts its shadow onto another one of its cells (say, a cell 122), thereby causing the cell 122 to stop generating electricity, the I-V characteristics changes into the curve 133.

In other words, the dye-sensitized solar cell decreases in output voltage approximately in proportion to the number of the cells which have stopped generating electricity as the result of being shaded by an object approaching it.

Consequently, the control unit 101 can easily grasp the number of cells not generating electricity simply by monitoring the voltage across the terminals of the set having cells connected in series. Thus, the control unit 101 can perform any processing according to the number of the cells not generating electricity.

With the individual cells arranged in array and connected together in series as shown in FIG. 4A, the control unit 101 can easily detect the presence as well as the size and shape of an object existing near the dye-sensitized solar cell 102. In other words, the control unit 101 can easily detect the details of an object.

Moreover, the dye-sensitized solar cell that functions as a sensor generates electric power with the help of sunlight in the same way as ordinary solar cells when none of its cells is shaded by an object. Therefore, the control unit 101 relies its operation on electric power generated by the dye-sensitized solar cell 2, and hence it does not need external power supply or secondary batteries.

The following is a description of the dye-sensitized solar cell that functions as a sensor.

2. Second Embodiment

Motion Sensor Window

Figure 5A:
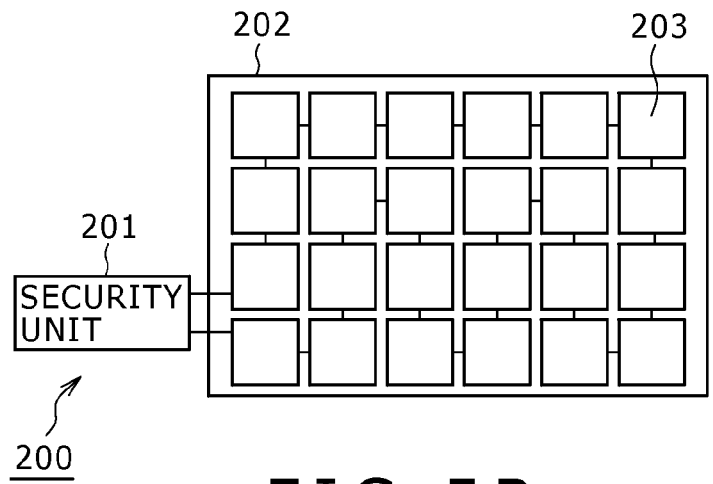
FIGS. 5A to 5C are diagrams illustrating an example of the motion sensor window to which the present disclosure is applied.
Figure 5B:
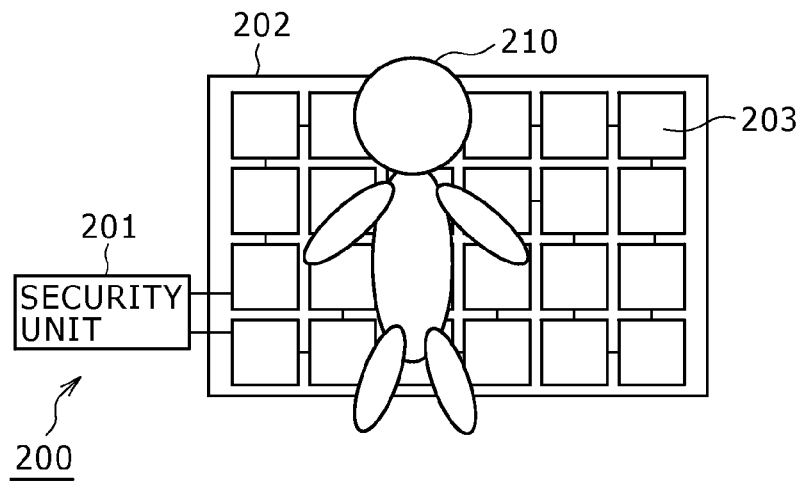
Figure 5C:
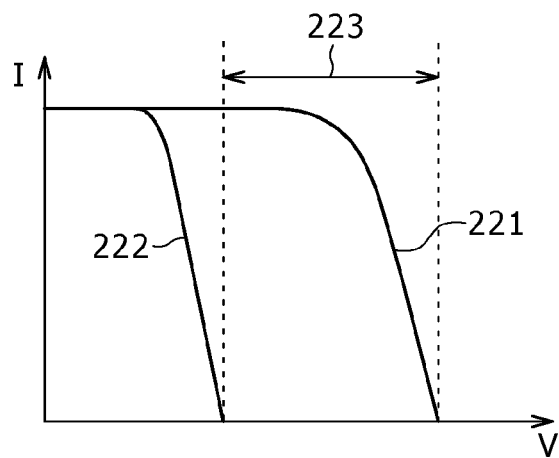

FIGS. 5A to 5C are diagrams illustrating an example of a motion sensor window to which the present disclosure is applied. The motion sensor window 200 includes a window 202 and a security unit 201. It is installed in a bright place where it receives sunlight. When a man approaches the window 202, the security unit 201 gives an alarm by means of sounds, images, letters, light, vibration, or the like.

The window 202 has 24 pieces of transparent dye-sensitized solar cells 203 (DSSC for short hereinafter) which are arranged in array and connected together in series. The individual constituents of the DSSC 203 may be arranged in any pattern other than array. They also be connected in any order.

The set of the serially connected cells of the DSSC 203 has the terminals connected to the security unit 201.

For example, as shown in FIG. 5B, when a man 210 approaches the window 202, those cells of the DSSC 203 which are shaded by the man 210 stop generating electricity. Therefore, the voltage across the output terminals of the window 202 decreases in an amount corresponding to the number of shaded cells of the DSSC 203, as mentioned above in the first embodiment.

The security unit 201 determines whether or not the object approaching the window 202 is a man according to the amount of voltage drop. For example, it is assumed that the set of the serially connected cells of the DSSC 203 gives the I-V characteristics which changes from the one indicated by the curve 221 to the one indicated by the curve 222 in FIG. 5C as the situation changes from the one shown in FIG. 5A to the one shown in FIG. 5B. Then, the security unit 201 estimates the size of the object approaching the window 202 according to the amount of voltage drop indicated by the double-headed arrow 223. Then the security unit 201 determines whether or not the detected object is the man 210 according to the size of the object.

Thus, the security unit 201 easily detects not only the presence of an object near the window 202 but also the size and shape of the object. In other words, the security unit 201 can easily detect the details of an object. The foregoing system simplifies the wiring of the window 202, which leads to cost reduction. The cells of the DSSC 203 can be arranged over a broad range for efficient power generation.

[Security Unit]

Figure 6:
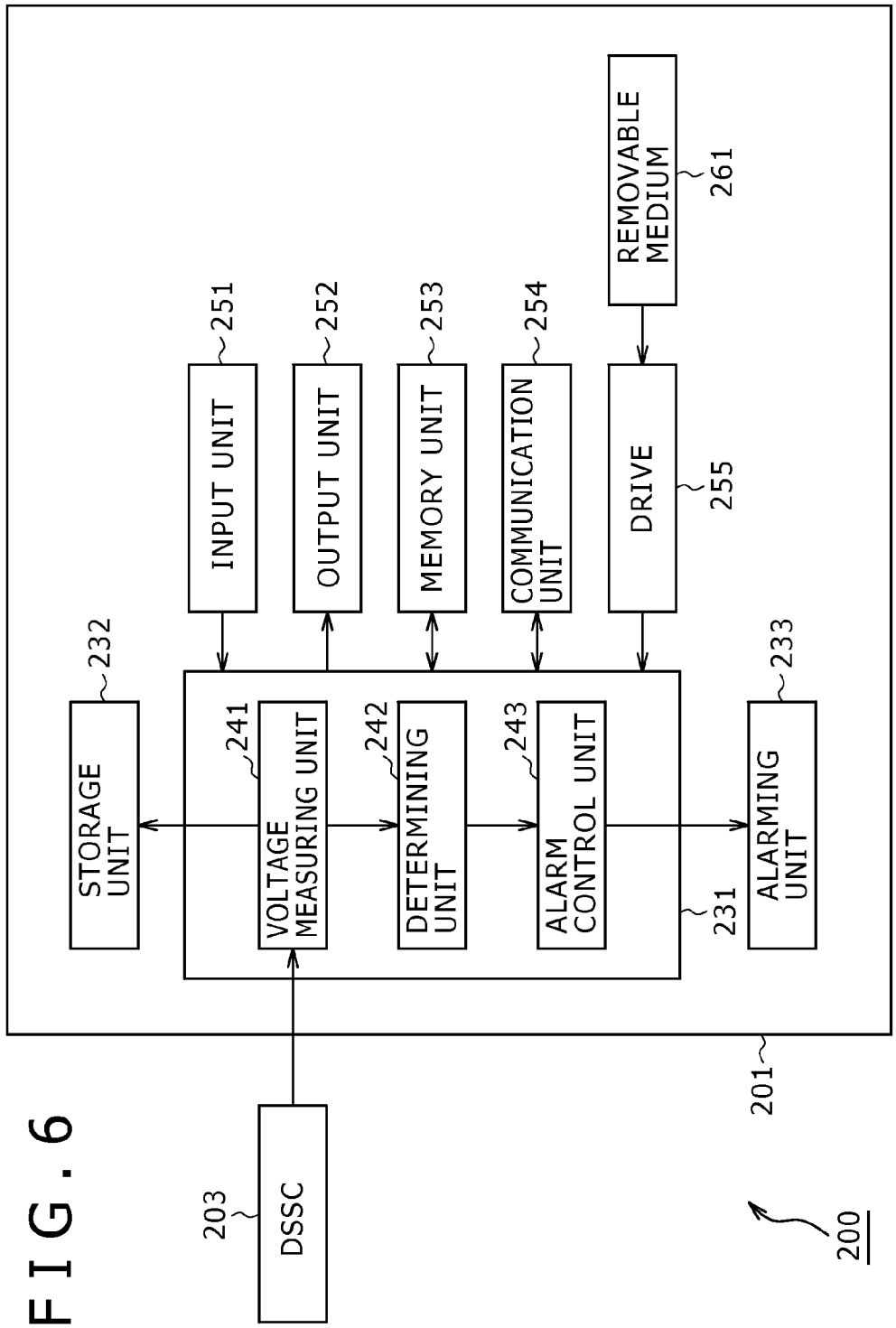
FIG. 6 is a block diagram illustrating an example of the major structure of the security unit.

FIG. 6 is a diagram illustrating in detail an example of the structure of the security unit 201.

The security unit 201 shown in FIG. 6 has a control unit 231, a storage unit 232, an alarming unit 233, an input unit 252, an output unit 252, a memory unit 253, and a communication unit 254.

The control unit 231 is composed of a CPU (Central Processing Unit), ROM (Read Only Memory), RAM (Random Access Memory), etc. It runs programs for detection of a man and an alarming process.

The storage unit 232 has, for example, a small lithium ion cell or capacitor, which stores electricity generated by the DSSC 203. Each part of the security unit 201 operates using power stored in the storage unit 232. The security unit 201 can operate without the help of external source provided with the storage unit 232, even though it may work with external source.

The alarming unit 233 has a speaker, monitor, vibrator, or the like. It gives an alarm that the man 210 has been detected near the window 202, by means of sound, image, letter, light, vibration, or the like, controlled by the control unit 231.

The input unit 251 may be any input device or input terminal, such as keyboard, mouse, button, and touch panel. It receives information entered from the outside by the user or any other devices, and then it sends the received information to the control unit 231.

The output unit 252 may be a CRT (Cathode Ray Tube) display, LCD (Liquid Crystal Display), speaker, output terminal, or the like. It supplies the user with the information received from the control unit 231 after conversion into image or sound. It may also supply other devices with such information in the form of prescribed signals.

The memory unit 253 may be an SSD (Solid State Drive), such as a flash memory, or a hard disk. It stores information supplied from the control unit 231 or supplies stored information to the control unit 231.

The communication unit 254 carries out communications with other devices through the network (including Internet) by means of an interface or a modem for a wired LAN (Local Area Network) or a wireless LAN. The communication unit 254, which is under control by the control unit 231, acquires computer programs through a network (including Internet) and installs them in the memory unit 253.

The security unit 201 is connected to a drive unit 255, if necessary, so that computer programs are installed in the memory unit 253 from a removable medium 261 such as a magnetic disk, an optical disk, and a magneto-optical disk mounted on the drive unit 255, or a semiconductor memory.

The control unit 231 has a voltage measuring unit 241, a determining unit 242, and an alarm control unit 243.

The voltage measuring unit 241 measures voltage across the positive and negative terminals of the DSSC 203 composed of a plurality of cells connected in series (24 cells in the case shown in FIG. 5A). The voltage to be measured is the sum of output voltages of the individual cells of the DSSC 203.

The electric power supplied from the DSSC 203 is stored in the storage unit 232.

The voltage measuring unit 241 sends the result of measurement (voltage) to the determining unit 242. The determining unit 242 determines, according to the voltage received from the voltage measuring unit 241, whether or not the object detected by the window 202 is a man for which an alarm should be given. The determining unit 242 obtains the amount of voltage drop from the voltage and then estimates the number of the cells of the DSSC 203 which are shaded by the object (or which do not generate electricity). It further estimates the size of the object from the estimated number of the cells and then it determines, according to the estimated size of the object, whether or not the object is a man for which an alarm should be given.

If the determining unit 242 determines that the object near the window 202 is a man for which an alarm should be given, it informs the alarm control unit 243 of the result of decision. The alarm control unit 243 controls the alarming unit 233 in response to the information received, so that the alarming unit 233 gives an alarm by means of sound, message, image on monitor, light (by LED), or vibration.

[Security Processing]

Figure 7:
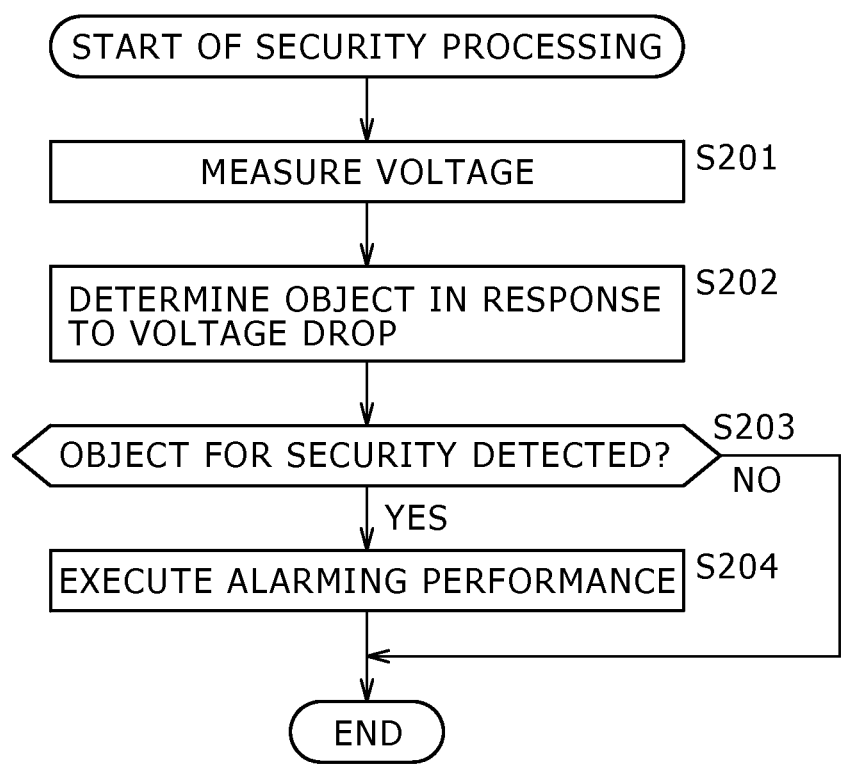
FIG. 7 is a flow chart illustrating an example of the flow of security processing.

The security unit 201 executes the processing mentioned above according to the flow chart shown in FIG. 7.

The security processing may be executed repeatedly at regular or irregular intervals. That is, it may be executed at any prescribed time or at any time when a prescribed event occurs. Or, it may be executed continuously and repeatedly.

As soon as the security processing starts, the voltage measuring unit 241 of the control unit 231 measures the voltage across the positive and negative terminals of the DSSC 203, in the step S201. The determining unit 242 determines, according to the amount of voltage drop, whether or not the object approaching the window 202 is an object (for example, a man) for which an alarm should be given, in Step S202.

If the determining unit 242 determines that an object for security has been detected in Step S203, it proceeds to Step S204. The alarm control unit 243 controls the alarming unit 233 to execute an alarming performance, in Step S204. Thus, the security processing ends.

If the determining unit 242 determines that the detected object is not an object for security, in Step S203, it skips Step S204, and the security processing ends.

As mentioned above, the security unit 201 can easily identify the object for security by the amount of voltage drop through the measurement of voltage across the terminals of the DSSC 203 composed of cells connected in series. In other words, the motion sensor window 200 can easily detect the details of the object.

To be more precise, the motion sensor window 200 simplifies not only the structure (or the circuit for DSSC 203) of the window 202 but also the security processing of the security unit 201. Consequently, the motion sensor window 200 reduces not only the cost for development and production but also the power consumption. In addition, the simplified structure improves reliability.

The determining unit 242 described above determines whether or not the detected object is the one for security according to the amount of voltage drop or the size of the detected object. However, it may be modified such that it measures the length of time for detection. In this case, it will determine that the detected object is the one for security if an object larger than a prescribed size is detected for a time longer than a prescribed length.

Such modification will reduce the possibility of false detection.

3. Third Embodiment

Card-Type Remote Controller

Figure 8:
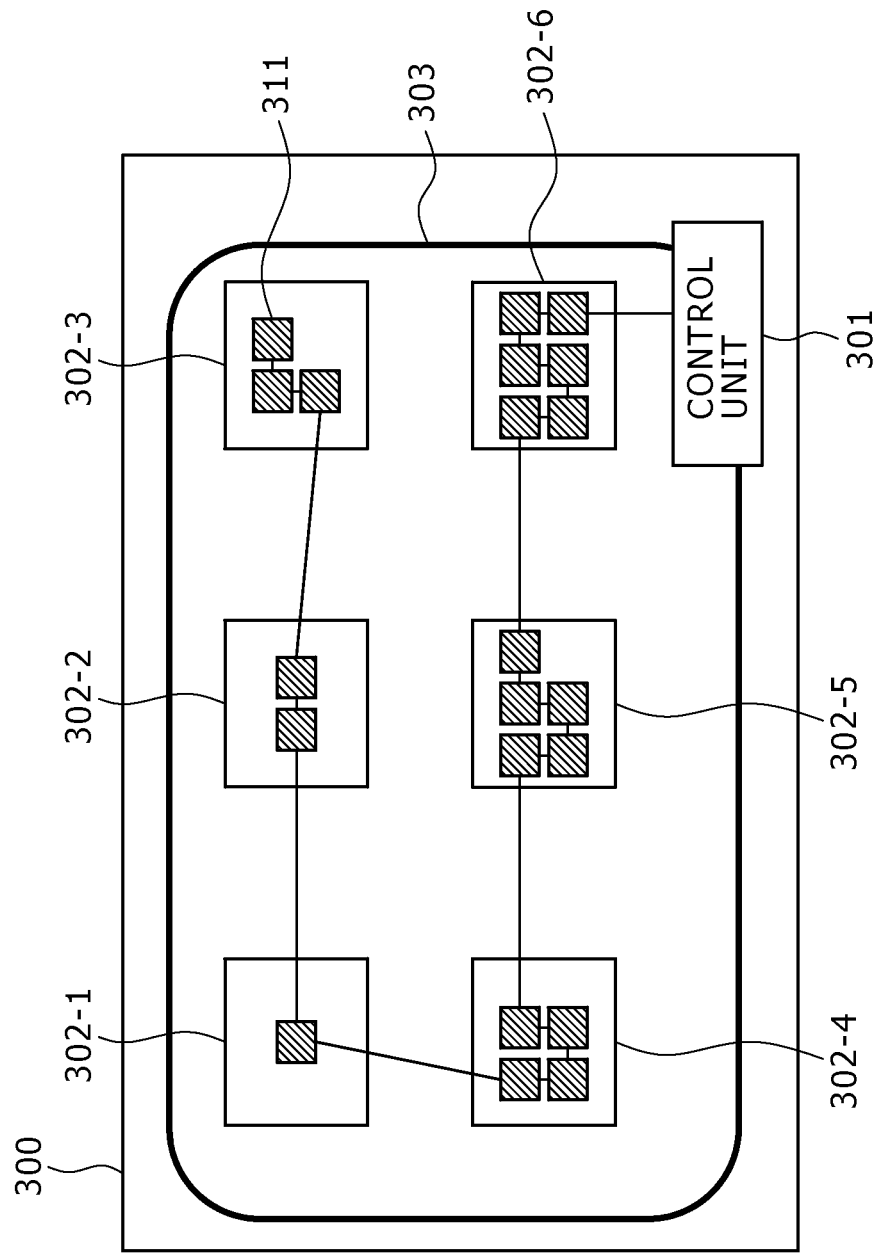
FIG. 8 is a diagram illustrating the card-type remote controller to which the present disclosure is applied.

FIG. 8 is a diagram illustrating an example of a card-type remote controller to which the present disclosure is applied.

The card-type remote controller 300 shown in FIG. 8 allows the user to control any electronic device, such as television and recorder, at a distant place. The card-type remote controller 300 has a user interface which accepts the user's operation.

The user interface for the card-type remote controller 300 includes six button regions 302-1 to 302-6. These six button regions 302-1 to 302-6 will be collectively referred to as button region 302 hereinafter if it not necessary to identify them individually. The button region 302 is not restricted in number, size and shape. Each button region 302 may differ in shape from another.

The button region 302 functions as the button. Each of the button region 302 has the DSSC 311. The DSSC 311 in each of the button region 302 generates electricity at a place where it receives sunlight. When the user touches (or shades) the DSSC 311 with his finger, the shaded DSSC 311 stops generating electricity.

The individual members of the DSSC 311 are connected together in series and the set of the DSSC 311 has its terminals connected to a control unit 301, as shown in FIG. 8.

In FIG. 8, the lines connecting the individual members of the DSSC 311 schematically illustrate that they are connected together in series, but they are not actual wiring. In actual, the set of the DSSC 311 is connected to the control unit 301 through its both terminals. The individual members of the DSSC 311 may be connected in any order so long as they are connected in series.

As shown in FIG. 8, each button region 302 has the cells of the DSSC 311 in different number. In FIG. 8, the button region 302-1 has one cell of the DSSC 311, the button region 302-2 has two cells of the DSSC 311, the button region 302-3 has three cells of the DSSC 311, the button region 302-4 has four cells of the DSSC 311, the button region 302-5 has five cells of the DSSC 311, and the button region 302-6 has six cells of the DSSC 311. The control unit 301 knows the number of the cells of the DSSC 311 arranged in each button region 302 in advance. Each button region 302 may have as many cells of the DSSC 311 as necessary so long as the control unit 301 knows the number of cells in advance.

Since the cells of the DSSC 311 in each button region differs in number, the cells of the DSSC 311 which stop generating electricity when the user operates the button region 302 also differ in number from one button region 302 to another. In other words, the control unit 301 can identify the button region 320 operated by the user if it measures the voltage of the set and detects the amount of its voltage drop.

Each button region 320 may have the cells of the DSSC 311 in specific number so that one or more button regions 302 operated by the user are distinguished from other button regions 302 (which are not operated). For example, the cells of the DSSC 311 may be arranged as follows. The button region 302-1 has one cell, the button region 302-2 has two cells, the button region 302-3 has four cells, the button region 302-4 has eight cells, the button region 302-5 has 13 cells, and the button region 302-6 has 29 cells.

Incidentally, the size of the individual DSSC 311 may differ from one another (that is, capacity for power generation or voltage of the individual DSSC 311 may differ from one another).

Whichever method may be employed, the cells of the DSSC 311 are arranged in each button region 302 so that the control unit 301 can identify the operated button region 302 by the amount of voltage drop from the voltage which is generated by all the members of the DSSC 311.

Having identified the button region 302 operated by the user, the control unit 301 sends control signals (in the form of radio signals) corresponding to the identified button region 302 to the electronic device controlled by the card-type remote controller 300 through the antenna 303. Incidentally, the transmission and reception of the control signals may conform to any communication standards. They may be accomplished by radio communication using electromagnetic wave or infrared communication. The communication standards may include Bluetooth (registered trademark) and Wi-Fi (registered trademark).

The card-type remote controller 300 mentioned above does not need moving parts such as buttons (which are vulnerable to failure due to age deterioration) as the user interface. Therefore, the card-type remote controller 300 has high reliability.

[Control Unit]

Figure 9:
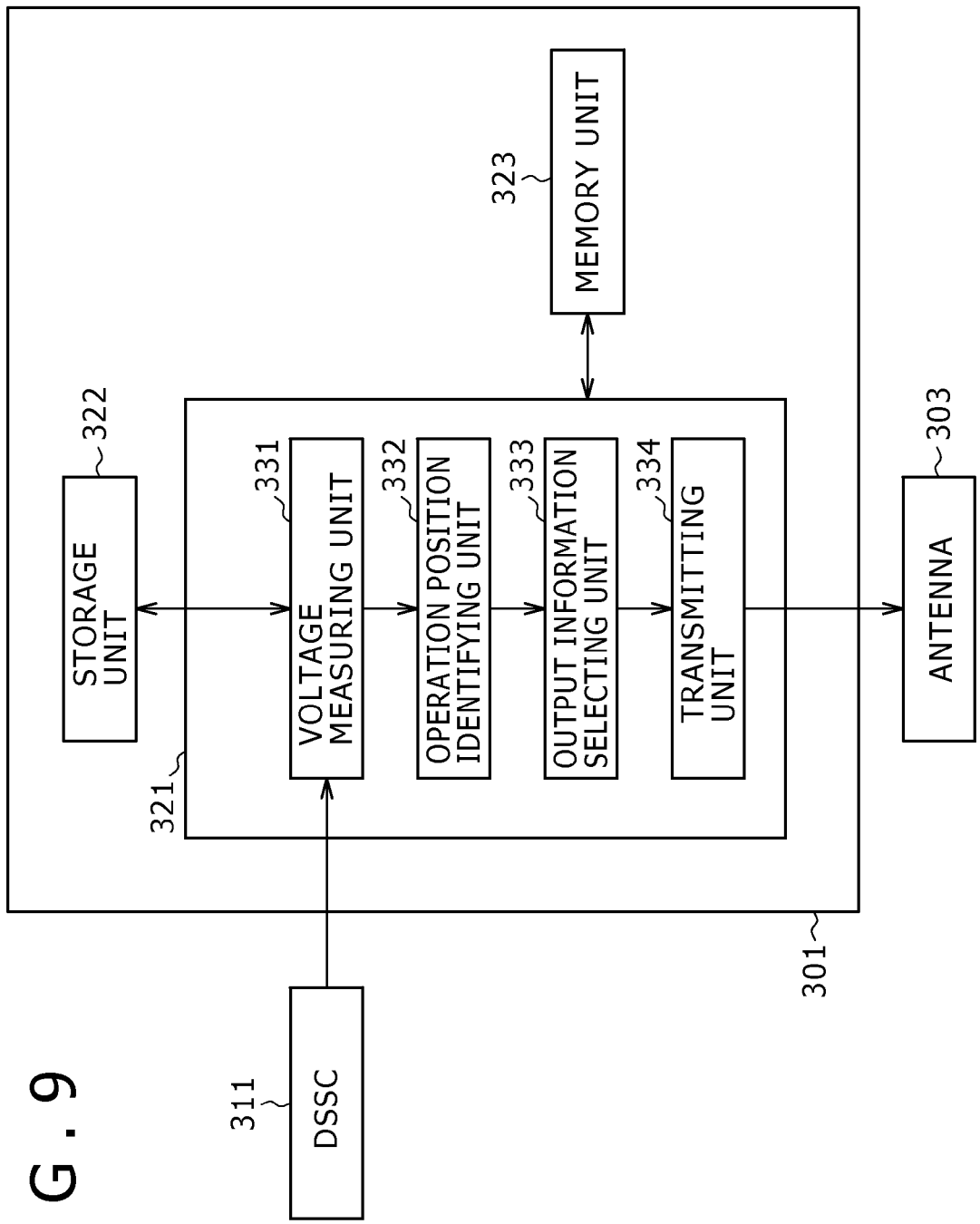
FIG. 9 is a diagram illustrating an example of the major structure of the control unit.

FIG. 9 is a block diagram illustrating an example of the main structure of a control unit 301.

As shown in FIG. 9, the control unit 301 has a signal processing unit 321, a storage unit 322, and a memory unit 323.

The signal processing unit 321 executes any processing relating to the detection of the position for user operation. The storage unit 322 stores electric power generated by the DSSC 311. The electric power stored in the storage unit 322 is used to activate the signal processing unit 321, the memory unit 323, and the control unit 301.

The DSSC 311 as a sensor not only performs detection but also generates electricity through conversion of optical energy into electrical energy. Since the thus generated electricity is used by the control unit 301, the card-type remote controller 300 can work without requiring external power source. Moreover, the storage unit 322 temporarily stores electric power obtained by the DSSC 311, so that the control unit 301 is stably supplied with electric power.

The memory unit 323 stores programs and data and sends them to the signal processing unit 321 when necessary.

The signal processing unit 321 has a voltage measuring unit 331, an operation position identifying unit 332, an output information selecting unit 333, and a transmitting unit 334.

The voltage measuring unit 331 measures the voltage across the positive and negative terminals of the set of a plurality of DSSC 311 connected in series. The operation position identifying unit 332 measures the amount of voltage drop (or the amount of decrease in power generation) from the voltage in the initial state (with the button region 302 remaining untouched by the user) according to the voltage supplied from the voltage measuring unit 331, and then the operation position identifying unit 332 identifies the button region 302 which has been operated by the user. The operation position identifying unit 332 sends the result to the output information selecting unit 333.

The output information selecting unit 333 selects the output information (control information) that corresponds to the button region 302 touched by the user which has been identified by the information received from the operation position identifying unit 332. There is previously established correspondence between the pattern of operation to the button region 302 by the user and the output information (or control information which the card-type remote controller 300 sends to electronic devices to be controlled), and the correspondence is stored in the memory unit 323.

The output information selecting unit 333 utilizes the correspondence to select the output information corresponding to the operation pattern of the button region 302 which has been identified by the operation position identifying unit 332. The output information selecting unit 333 sends the selected output information to the transmitting unit 334.

Incidentally, the output information selecting unit 333 may add any parameters and other information to the thus selected output information as necessary, thereby creating new output information, and send it to the transmitting unit 334. For example, the signal processing unit 321 may measure the length of time for the user to touch the button region 302, and the output information selecting unit 333 may add the information about the time of operation to the selected output information to send it to the transmitting unit 334. Thus, it will be possible for the card-type remote controller 300 to change the amount of control according to the length of time of operation to carry out control in various ways.

The transmission unit 334 sends out the output information supplied from the output information selecting unit 333 in the form of radio signals through the antenna 303.

Figure 10A:
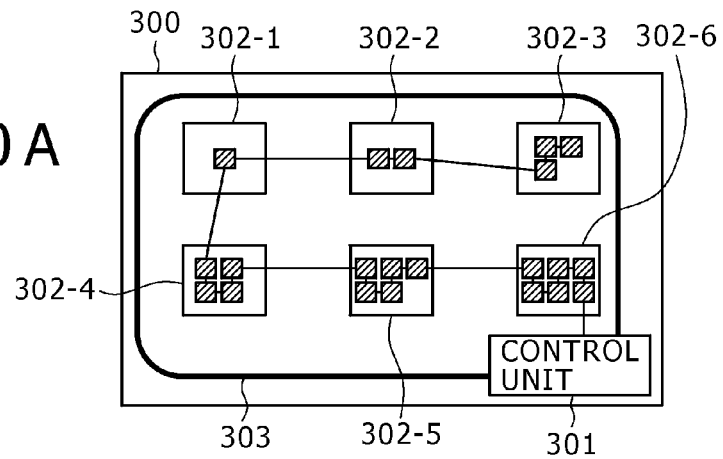
FIGS. 10A to 10C are diagrams illustrating an example of operation.
Figure 10B:
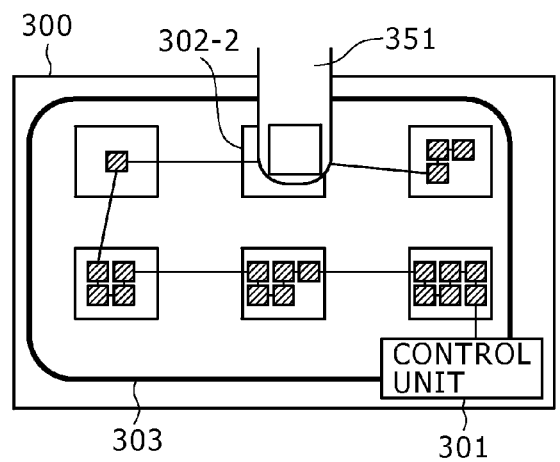
Figure 10C:
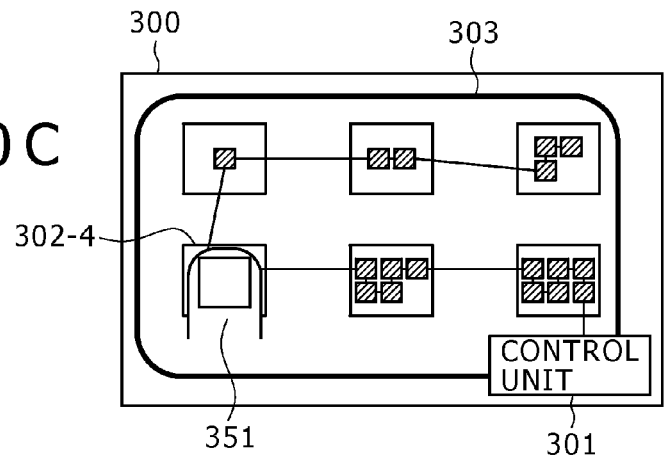

It is assumed that the card-type remote controller 300 takes on the initial state as shown in FIG. 10A when the user does not yet operate the button region 302. As shown in FIGS. 10B and 10C, when the user touches any one of the button region 302 with his finger 351, the finger 351 shades the DSSC 311 in the touched button region 302, thereby causing it to stop generating electricity. This results in a voltage drop of output voltage as indicated by the graph in FIG. 11.

It is assumed that the initial state shown in FIG. 10A gives the I-V characteristics indicated by the curve 361. When the user touches the button region 302-2 with his fiber 351 as shown in FIG. 10B, two DSSC 311 are shaded and the output voltage decreases from that in the initial state as suggested by the I-V characteristics indicated by the curve 362.

Also, when the user touches the button region 302-4 with his finger 351 as shown in FIG. 10C, four DSSC 311 is shaded and the output voltage decreases from that in the initial state as suggested by the I-V characteristics indicated by the curve 363.

As mentioned above, the amount of voltage drop varies depending on the number of the DSSC 311 arranged in the button region 302 which has been touched. Consequently, the operation position identifying unit 332 can easily identify the position of the button region 302 operated by the user. In other words, the card-type remote controller 300 can easily detect an object in more detail.

[Signal Output Processing]

Figure 12:
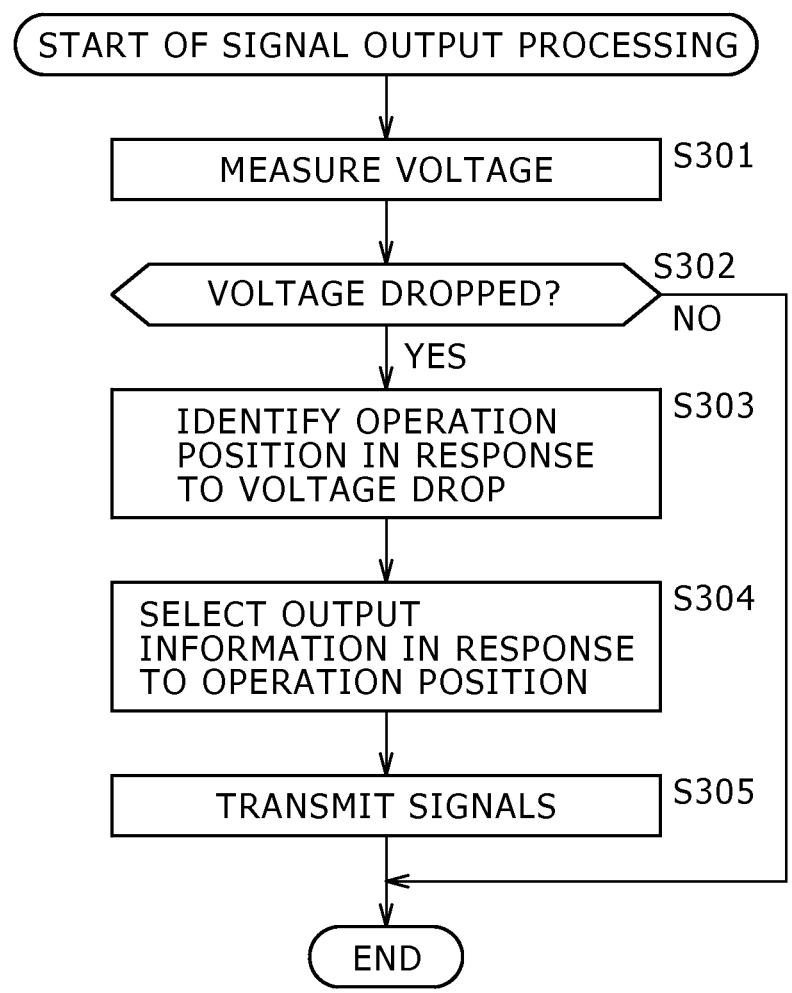
FIG. 12 is a flow chart illustrating an example of the flow of signal output processing.

The foregoing processing is accomplished by the signal processing unit 321, which works according to the flow chart for signal output processing shown in FIG. 12.

The signal output processing may be executed repeatedly at regular or irregular intervals. For example, it may be executed at any prescribed time or at any time when a prescribed event occurs. Or, it may be executed continuously and repeatedly.

When the signal output processing starts, the voltage measuring unit 331 of the signal processing unit 321 measures voltage across the positive and negative terminals of the DSSC 311 in Step S301. Next, the voltage measuring unit 331 determines whether or not the voltage has dropped in Step S302. If it determines that the voltage has dropped, the process proceeds to Step S303.

The operation position identifying unit 332 identifies the operation position (or the button region 302 which has been touched by the user) according to the amount of voltage drop, in Step S303. The output information selecting unit 333 selects the control information to be output according to the identified operation position of the button region, in Step S304.

In Step S305, the transmitting unit 334 transmits through the antenna 303 the output information (control information) selected by processing in Step S304.

The signal processing unit 321 completes its signal output processing as soon as it transmits the output signal.

If it is determined in Step S302 that there is no voltage drop (or the initial state remains), the voltage measuring unit 331 skips the processing in Steps S303 to S305 and completes the signal output processing.

As mentioned above, by using the dye-sensitized solar cells in the button region 302 as sensors, the card-type remote controller 300 works without requiring external power supply. Moreover, the card-type remote controller 300 permits simple wiring between the control unit 301 and the DSSC 311 and permits the control unit 301 to perform signal output processing more simply. As the result, the card-type remote controller 300 reduces not only cost for development and production but also power consumption. In addition, the card-type remote controller 300 improves reliability owing to its simple structure.

The card-type remote controller mentioned above is not restricted in its shape.

To illustrate typical applications of the present disclosure, the security unit (motion sensor window) and the remote controller (card-type remote controller) have been described above. However, the present disclosure will be applied to any devices and systems with sensing functions.

Some applications include user interfaces for electric devices such as personal computers, AV devices, and electric home appliances; user interfaces for portable terminals such as portable game machines, calculators, and portable telephones; and sensors for lighting equipment, automatic doors, room entry and exit monitoring systems, and disaster prevention systems.

The system mentioned above is so designed as to identify the number of cells generating electricity according to change in the amount of power generation (or the amount of voltage drop), thereby detecting the size, shape, or position of an object. It may be so modified as to recognize the area of the part which is shaded by an object.

An example of such modification is described with reference to FIGS. 13A and 13B. The sensor shown in FIG. 13A includes the DSSC 402 and the control unit 401, which are connected to each other. The control unit 401 is a sensor for detecting any object according to the change in power generation (or the amount of voltage drop) in the DSSC 402, in the same way as mentioned above, excepting that the DSSC 402 has only one cell.

Figure 13A:
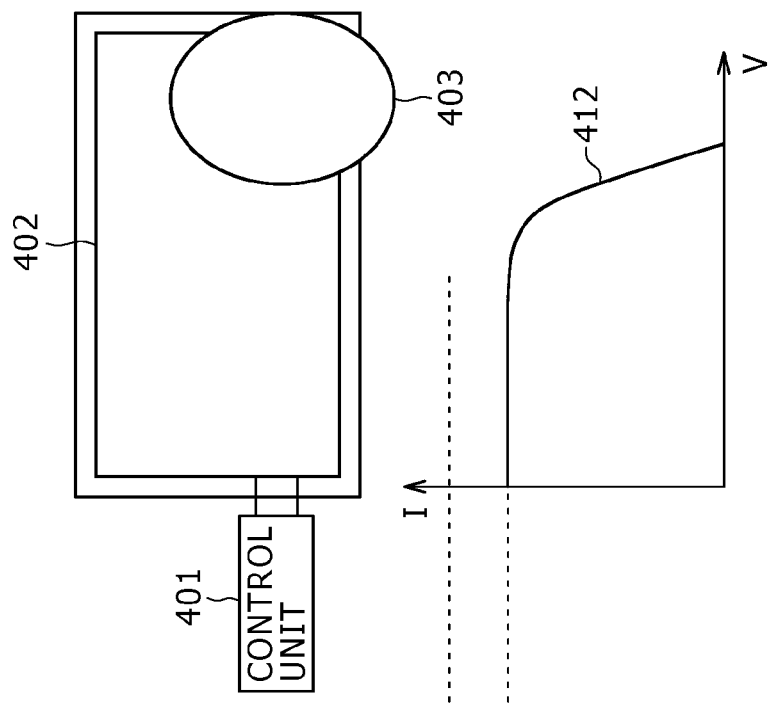
FIGS. 13A and 13B are diagrams illustrating an example of the case in which a shadow is cast onto a portion of cells.

FIG. 13A shows the sensor which does not yet detect any object because there is no object approaching the DSSC 402. In this state, the DSSC 402 gives the I-V characteristics as indicated by a curve 411 of the graph at the bottom of the figure.

Figure 13B:
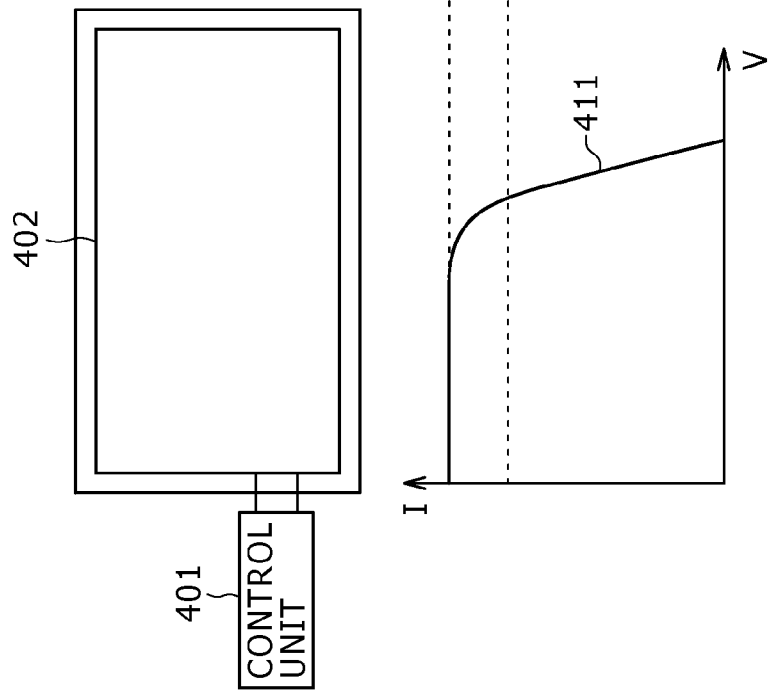

The diagram in FIG. 13B shows the sensor (the same one as shown in FIG. 13A) whose DSSC 402 has a shadow 403 of an object existing near the DSSC 402.

In this state, the I-V characteristics are indicated by a curve 412 in the graph at the bottom of the figure. In other words, the shadow 403 reduces the surface area of the DSSC 402 for power generation, and the I-V characteristics of the DSSC 402 (as indicated by the curve 412) change in proportion to the reduction in surface area, thereby bringing about voltage drop (or decreasing power generation).

As mentioned above, the DSSC 402 varies in power generation (or voltage) approximately in proportion to its surface area. In other words, the control unit 401 can detect the shaded area of the cell according to the change in power generation (or the amount of voltage drop). In this way, the control unit 401 can detect the size and shape of an object in more detail. (The size of an object that can be detected may be smaller than the size of a single cell.)

Figure 14A:
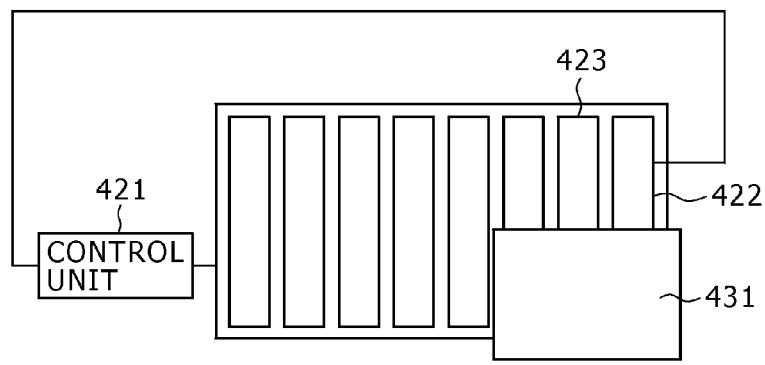
FIGS. 14A to 14C are diagrams illustrating an example of the case in which a shadow is cast onto a portion of cells.
Figure 14B:
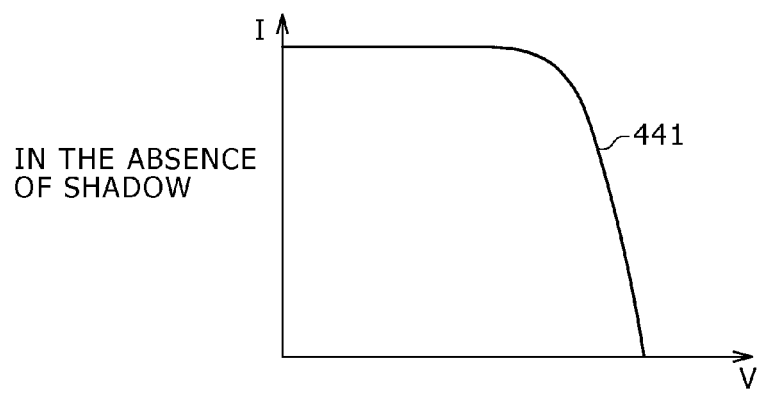
Figure 14C:
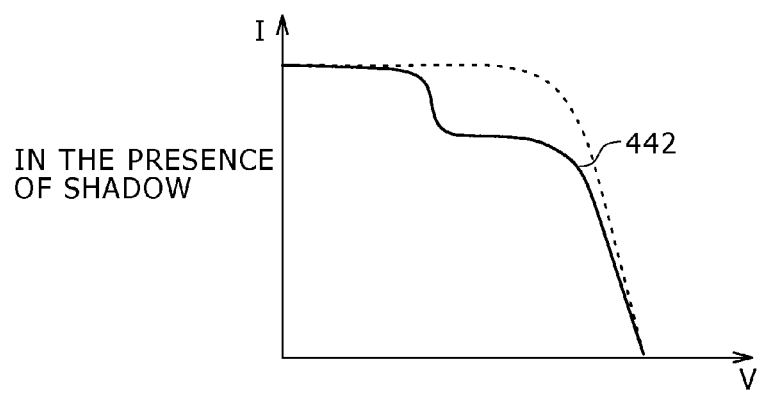

Another example of applications is shown in FIGS. 14A to 14C. The sensor shown in FIG. 14A has the control unit 421 connected thereto which detects any object approaching the sensor according to the change in power generation (or the amount of voltage drop) of the DSSC 422. The DSSC 422 includes a plurality of cells 423 connected together in series. In other words, the control unit 421 detects voltage across the terminals of the set of cells connected together in series.

It is assumed that an object approaches the DSSC 422 and casts its shadow 431 on one or more cells 423, as shown in FIG. 14A. In this situation, the amount of power generation (or voltage) by each cell 423 decreases approximately in proportion to the size of the shadow, as described above with reference to FIGS. 13A and 13B.

That is, the I-V characteristics of the DSSC 422 are indicated by a curve 441 in FIG. 14B when there exists no object near the DSSC 422 (or when the DSSC 422 is not shaded), but the I-V characteristics of the DSSC 422 are indicated by a curve 442 in FIG. 14C when an object approaches the DSSC 422 and casts its shadow 431 on one or more of cells 423 (when the DSSC 422 is shaded).

Thus, the DSSC 422 changes in I-V characteristics (or changes in power generation or voltage drop) according to the size of the shadow 431 of the object which approaches the DSSC 422. Therefore, the control unit 421 detects the change in power generation (or voltage drop), thereby detecting the size of the shadow 431 that covers that portion of the cells 423 which do not generate electricity. In this way, the control unit 421 can detect the size and shape of the object which approaches the DSSC 422.

Thus, the control unit 421 can identify the size or shape of the object which is smaller than a single cell (the control unit 421 can identify in detail). That is, the sensors shown in FIGS. 13A and 13B and 14A to 14C can easily detect an object in more detail.

Owing to a plurality of cells employed as shown in FIG. 14A, the control unit 421 can easily detect how much portion of each cell is shaded (or the size of the area of each cell where electricity is not generated). In other words, the control unit 421 can detect not only the size and shape of an object in more detail but also the position of an object.

If a sensor with the DSSC 422 replaced by silicon based solar cells is used, the amount of electricity generated changes in proportion to the area of the cells on which a shadow is cast. However, it greatly decreases in voltage even when one of the cells stops generating electricity, as mentioned above. Therefore, it can hardly detect the size, shape, and position of an object.

In contrast, the DSSC 422 continues to generate electricity even when a portion of its cells shaded by an object although it decreases in the amount of electricity generated in proportion to the area of the shaded cells. Therefore, the control unit 421 can detect the size, shape, and position of an object in more detail.

The series of processing mentioned above may be accomplished by means of hardware as well as software.

In the case where the series of processing mentioned above is accomplished by means of software, the programs constituting the software may be installed from network or record medium.

The record medium includes a magnetic disk (including a flexible disk), an optical disk (including a CD-ROM (Compact Disc-Read Only Memory) and a DVD (Digital Versatile Disc)), and a magneto-optical disk (MD (Mini Disc)), which contain programs recorded thereon and are distributed to the users for delivery of programs. It also includes a removable medium 261 of a semiconductor memory. It also includes a hard disk mounted in the memory unit 253 or 323.

The computer program mentioned above may be the one which is executed in the chronological order as explained in this specification or the one which is executed in parallel or according to need.

The steps to describe the program recorded in the record medium may be arranged in the chronological order mentioned above or in parallel or in individual processes.

The structure explained above as one device (or processing unit) may include two or more devices (or processing units). Alternatively, the structure explained above as having two or more devices (or processing units) may be the one which has only one device (or processing unit). The structure mentioned above may be incorporated with other device (or processing unit) in addition to those mentioned above. As long as the constitution and structure for the entire system are substantially the same, a part of a certain device (or a processing unit) may be incorporated in other devices (or processing units). In other words, the embodiments of the present disclosure are not limited to those mentioned above, but they may be variously modified within the scope of the present disclosure.

The present disclosure contains subject matter related to that disclosed in Japanese Priority Patent Application JP 2010-157540 filed in the Japan Patent Office on Jul. 12, 2010, the entire content of which is hereby incorporated by reference.

What is claimed is:

1. An information processing device comprising:
   a voltage measuring unit configured to measure a voltage across positive and negative terminals of a set of a plurality of dye-sensitized solar cells connected in series; and
   a determining unit configured to determine a number of dye-sensitized solar cells not generating electricity according to an amount of voltage drop across the positive and negative terminals from the voltage across the positive and negative terminals in an initial state in which all the dye-sensitized solar cells in the set generate electricity at the voltage measured by the voltage measuring unit.

2. The information processing device according to claim 1, further comprising:
   a process executing unit configured to execute processing according to the number of the dye-sensitized solar cells not generating electricity determined by the determining unit.

3. The information processing device according to claim 2, wherein the determining unit determines the number of the dye-sensitized solar cells not generating electricity, thereby estimating a size of an object existing near the set, and determines according to the estimated size whether or not the object is to be processed, and
   the process executing unit executes an alarming process to inform of the existence of the object in a case where the determining unit determines that the object is to be processed.

4. The information processing device according to claim 2, wherein the dye-sensitized solar cells in the set are arranged such that they are divided into a prescribed plurality of regions and they are distributed among such regions in different numbers,
   the determining unit determines the number of the dye-sensitized solar cells not generating electricity, thereby identifying the region operated by a user among the plurality of regions, and
   the process executing unit selects control signals corresponding to the identified region and sends the selected control signals to other devices.

5. The information processing device according to claim 1, wherein the dye-sensitized solar cells of the set are arranged in array.

6. The information processing device according to claim 1, further comprising:
   a storage unit configured to store the electric power obtained from power generation by the dye-sensitized solar cells in the set.

7. The information processing device according to claim 1, wherein the determining unit determines, according to the amount of the voltage drop across the positive and negative terminals, a size of a portion of the regions in which the dye-sensitized solar cells do not generate electricity.

8. An information processing method comprising:
   measuring a voltage across positive and negative terminals of a set of plurality of dye-sensitized solar cells connected in series, and
   determining a number of the dye-sensitized solar cells not generating electricity according to an amount of voltage drop across the positive and negative terminals from the voltage across the positive and negative terminals in an initial state in which all the dye-sensitized solar cells in the set generate electricity.

* * * * *